(12) United States Patent
Namkung et al.

(10) Patent No.: US 9,460,644 B2
(45) Date of Patent: Oct. 4, 2016

(54) FLEXIBLE DISPLAY APPARATUS

(71) Applicant: Samsung Display Co., Ltd., Yongin, Gyeonggi-do (KR)

(72) Inventors: Jun Namkung, Asan-si (KR); Chulwoo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 77 days.

(21) Appl. No.: 14/603,125

(22) Filed: Jan. 22, 2015

(65) Prior Publication Data

US 2015/0313004 A1 Oct. 29, 2015

(30) Foreign Application Priority Data

Apr. 28, 2014 (KR) .................. 10-2014-0050942

(51) Int. Cl.
| | | |
|---|---|---|
| *H05K 5/00* | (2006.01) | |
| *G09F 9/30* | (2006.01) | |
| *G06F 1/16* | (2006.01) | |
| *G02F 1/1333* | (2006.01) | |

(52) U.S. Cl.
CPC ......... *G09F 9/301* (2013.01); *G02F 1/133308* (2013.01); *G06F 1/1652* (2013.01)

(58) Field of Classification Search
CPC combination set(s) only.
See application file for complete search history.

(56) References Cited

U.S. PATENT DOCUMENTS

| 8,229,522 B2 * | 7/2012 | Kim | H04M 1/0216 361/679.06 |
|---|---|---|---|
| 8,811,032 B2 * | 8/2014 | Ladouceur | H04M 1/0268 361/679.06 |
| 9,239,594 B2 * | 1/2016 | Lee | G06F 1/1652 |
| 9,287,341 B2 * | 3/2016 | Cheon | H01L 51/0097 |
| 9,294,597 B2 * | 3/2016 | Tan | H04M 1/0268 |
| 9,299,755 B2 * | 3/2016 | Namkung | G09G 3/34 |
| 2014/0029190 A1 * | 1/2014 | Sato | G06F 17/1641 361/679.27 |
| 2014/0092566 A1 * | 4/2014 | Shirasaka | H05K 5/0017 361/749 |
| 2015/0146385 A1 * | 5/2015 | Kim | G02F 1/13 361/749 |
| 2015/0146387 A1 * | 5/2015 | Lee | G06F 1/1652 361/749 |

FOREIGN PATENT DOCUMENTS

| JP | 5181009 B2 | 4/2013 |
|---|---|---|
| JP | 5236767 B2 | 7/2013 |
| KR | 10-2009-0061459 A | 6/2009 |
| KR | 10-2013-0076402 A | 7/2013 |
| KR | 10-2015-0007632 A | 1/2015 |

OTHER PUBLICATIONS

Patent Abstracts of Japan for Application No. 2010-224728, filed Oct. 4, 2010, 1 page.
Patent Abstracts of Japan for Application No. 2011-71411, filed Mar. 29, 2011, 1 page.

* cited by examiner

*Primary Examiner* — Lisa Lea Edmonds
(74) *Attorney, Agent, or Firm* — Lewis Roca Rothgerber Christie LLP (57) ABSTRACT

A flexible display apparatus having a folding area and peripheral areas at sides of the folding area, the flexible display apparatus including: a flexible display panel configured to display an image; and an outer member on one surface of the flexible display panel and including a protrusion and an opening at the peripheral areas. The flexible display panel and the outer member are configured to be folded at the folding area, and the protrusion is inserted into the opening when the outer member is folded.

20 Claims, 12 Drawing Sheets

FLEXIBLE DISPLAY APPARATUS

CROSS-REFERENCE TO RELATED APPLICATION

This application claims priority to and the benefit of Korean Patent Application No. 10-2014-0050942, filed on Apr. 28, 2014, the contents of which are hereby incorporated by reference in its entirety.

BACKGROUND

1. Field

Aspects of embodiments of the present disclosure relate to a display apparatus. More particularly, aspects of embodiments of the present disclosure relate to a flexible display apparatus.

2. Description of the Related Art

In recent years, a flexible display apparatus, which is formed of a flexible material, e.g., plastic, to maintain display performance thereof even though it is bent in a similar manner as folding a paper, has been actively researched. The flexible display apparatus has been in the spotlight as a next generation display apparatus to replace various electronic equipments, such as a portable computer, an electronic newspaper, a smart card, printed media, etc.

The flexible display apparatus includes a flexible display panel. The flexible display panel includes a display area configured to display an image and a non-display area surrounding the display area. The non-display area includes various circuit parts and line parts to apply image signals to the display area, and is positioned at the same plane as the display area.

SUMMARY

An aspect of an embodiment of the present disclosure relates to a flexible display apparatus capable of reducing a non-display area.

An embodiment of the inventive concept provides a flexible display apparatus having a folding area and peripheral areas at sides of the folding area, the flexible display apparatus including: a flexible display panel configured to display an image; and an outer member on one surface of the flexible display panel and having a protrusion and an opening at the peripheral areas. The flexible display panel and the outer member are configured to be folded at the folding area, and the protrusion is inserted into the opening when the outer member is folded.

The folding area may be at at least one edge of the flexible display apparatus and may extend in a first direction.

The protrusion may be protruded from one surface of the outer member and may extend in the first direction.

The protrusion may include a plurality of protrusions, and the plurality of protrusions may be arranged along a second direction perpendicular to the first direction at regular intervals.

The protrusion may include a plurality of protrusions, and the plurality of protrusions may be arranged along the first direction at regular intervals.

The protrusion may have a quadrangular shape when viewed in a plan view.

The protrusion may include a plurality of convex portions protruding from a surface of the protrusion.

The opening may be formed by removing a portion of the outer member corresponding to a shape of the protrusion.

The flexible display apparatus may further include a wrinkle sheet at the folding area facing the flexible display panel such that the outer member is between the flexible display panel and the wrinkle sheet, and the wrinkle sheet may include a plurality of wrinkles extending in the first direction.

The wrinkle sheet may include a metal material.

The outer member may further have a groove corresponding to the folding area.

A portion of the one surface of the flexible display panel may be exposed through the groove.

The wrinkle sheet may be over the groove and facing the flexible display panel, and the wrinkle sheet may include a plurality of wrinkles extending in the first direction.

Another embodiment of the inventive concept provides a flexible display apparatus having a folding area and peripheral areas at sides of the folding area, the flexible display apparatus including: a flexible display panel configured to display an image; an outer member on one surface of the flexible display panel; and a flexible film facing the flexible display panel such that the outer member is between the flexible film and the flexible display panel, the flexible film including a protrusion and an opening at the peripheral areas, and the flexible display panel, the outer member, and the flexible film are configured to be folded at the folding area, and the protrusion is inserted into the opening when the flexible film is folded.

The flexible film may have an elastic modulus greater than an elastic modulus of the outer member.

The folding area may be at at least one edge of the flexible display apparatus and may extend in a first direction.

The protrusion may be protruded from one surface of the flexible film and may extend in the first direction.

The opening may be formed by removing a portion of the flexible film corresponding to a shape of the protrusion.

The flexible film and the outer member may further have a groove corresponding to the folding area.

The flexible display apparatus may further include a wrinkle sheet over the groove and facing the flexible display panel, and the wrinkle sheet may include a plurality of wrinkles extending in the first direction.

According to an aspect of an embodiment of the present disclosure, the flexible display apparatus may securely maintain the folded state thereof.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, directly connected to or directly coupled to the other element or layer, or one or more other intervening elements or layers may be present. When an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements or features described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein should be interpreted accordingly.

The terminology used herein is for the purpose of describing example embodiments only and is not intended to be limiting of the present invention. As used herein, the singular forms, "a", "an" and "the" are intended to include the plural forms as well, unless the context clearly indicates otherwise. It will be further understood that the terms "includes" and/or "including", when used in this specification, specify the presence of the stated features, integers, steps, operations, elements, and/or components, but do not preclude the presence or addition of one or more other features, integers, steps, operations, elements, components, or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, example embodiments of the present invention will be described in detail with reference to the accompanying drawings.

Figure 1A:
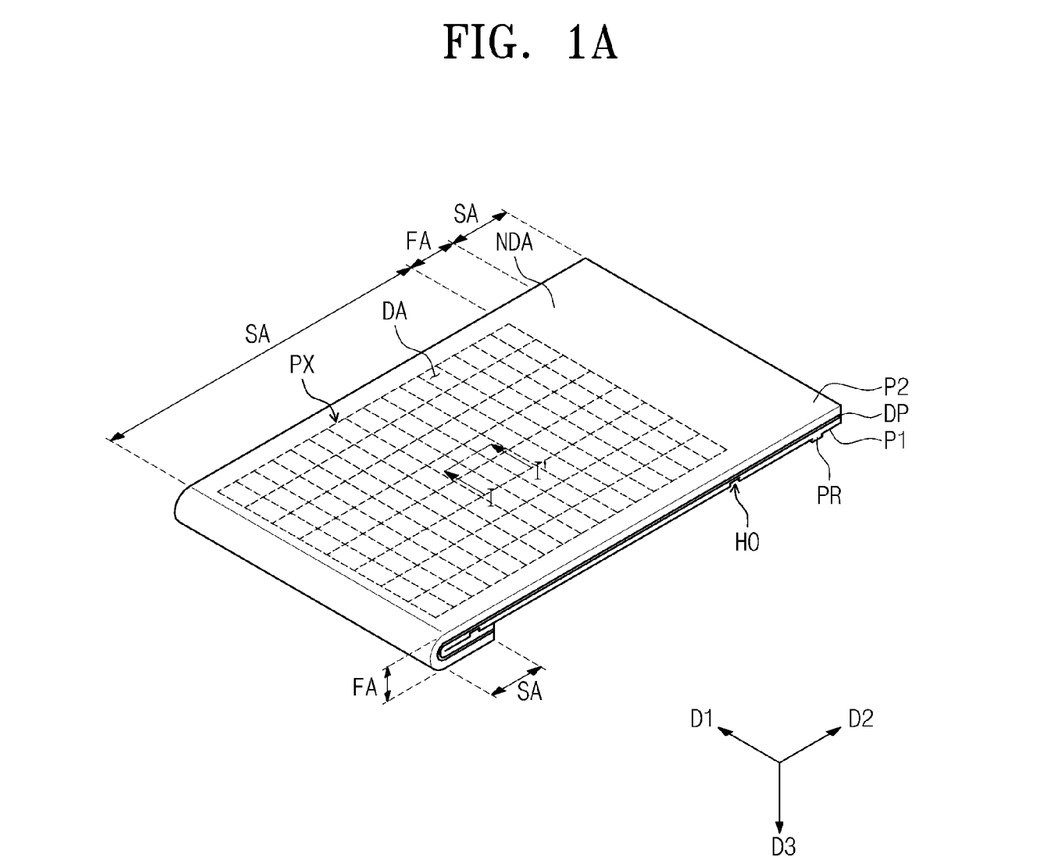
FIGS. 1A and 1B are perspective views showing a flexible display apparatus according to an example embodiment of the present disclosure.
Figure 1B:
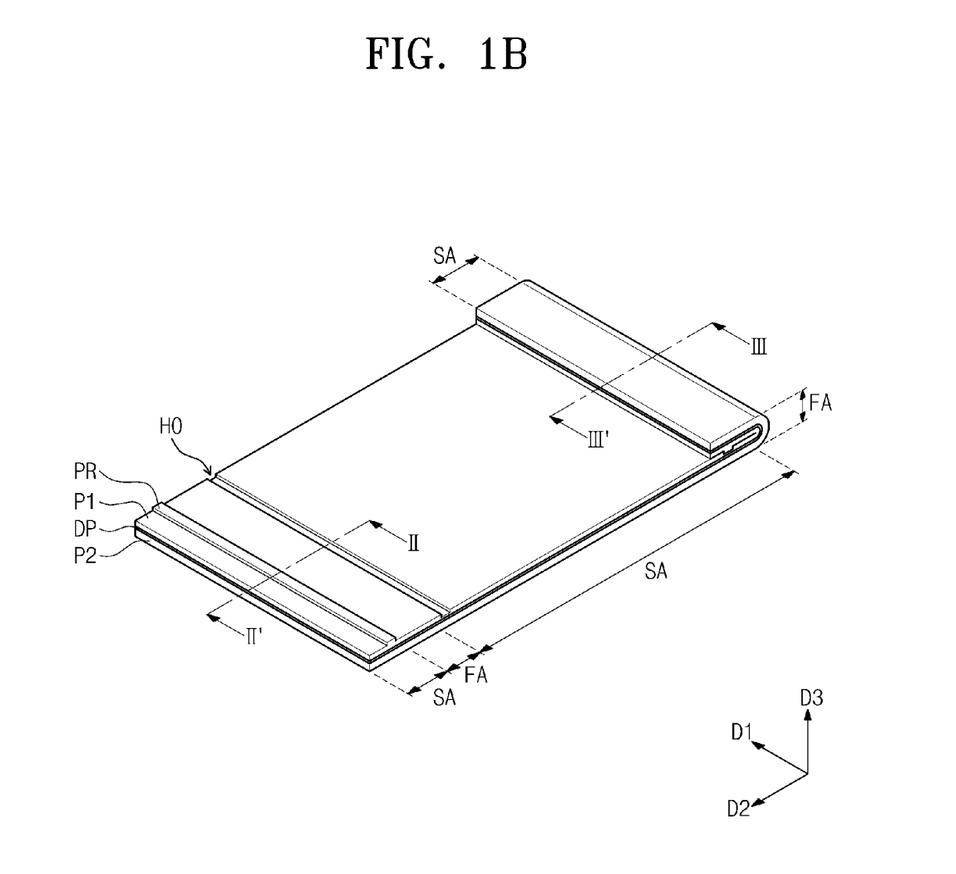

FIG. 1A is a perspective view showing a flexible display apparatus, which is partially folded, according to an example embodiment of the present disclosure. FIG. 1B is a perspective view showing the flexible display apparatus, which is turned upside down, shown in FIG. 1A.

Referring to FIGS. 1A and 1B, the flexible display apparatus includes a display area DA, on which an image is displayed, and a non-display area NDA disposed adjacent to at least one side of the display area DA.

For convenience, a direction in which the image is displayed in the flexible display apparatus is referred to as an upper direction, and a direction opposite to the upper direction is referred to as a lower direction, but the present invention should not be limited thereto or thereby.

In the present example embodiment, the flexible display apparatus has a rectangular shape defined by a pair of long sides and a pair of short sides. A direction in which the short sides extend is referred to as a first direction D1, and a direction in which the long sides extend is referred to as a second direction D2. In addition, the lower direction that is vertical or substantially vertical (e.g., perpendicular) to the first and second directions D1 and D2 is referred to as a third direction D3.

The flexible display apparatus may be curved in the upper or lower direction, or wrapped in one direction to have a curved surface, or folded in a specific area thereof. The flexible display apparatus includes a folding area FA, in which the flexible display apparatus is folded, and a peripheral area SA disposed adjacent to the folding area FA. The peripheral area SA may be flat or slightly curved.

In FIGS. 1A and 1B, the flexible display apparatus includes two folding areas FA and three peripheral areas SA. FIGS. 1A and 1B show one of the folding areas FA is folded and the other of the folding areas FA is stretched out. In the present invention, however, the number of the folding areas FA should not be limited thereto or thereby. That is, at least one folding area FA may be provided along at least one edge of the flexible display panel DP. In addition, the folding area FA may be provided at a center portion of the flexible display panel DP, rather than at the edge of the flexible display panel DP if desired or necessary. In the present example embodiment, the folding areas FA extend in the first direction D1 along the edges of the short sides of the flexible display apparatus. Further, the flexible display apparatus may be folded in the folding area FA shown in FIGS. 1A and 1B, which is shown as stretched out without being folded.

In FIG. 1A, the display area DA is overlapped with one peripheral area SA, but the present invention is not limited thereto or thereby. That is, the display area DA may be overlapped with the folding area FA and a portion of the other peripheral areas SA. When the display area DA is overlapped with the peripheral area SA and the folding area FA, the image may be displayed in the peripheral area SA and the folding area FA.

The flexible display apparatus includes a flexible display panel DP, a first outer member P1 disposed on one surface of the flexible display panel DP, and a second outer member P2 disposed on the other surface of the flexible display panel DP.

The flexible display panel DP displays an image. The flexible display panel DP may be an organic light emitting display panel or a plasma display panel, but the present invention is not limited thereto or thereby. That is, for example, the flexible display panel DP may be a liquid crystal display panel, an electrowetting display panel, an electrophoretic display panel, or a microelectromechanical (MEMS) display panel. In the present example embodiment, the organic light emitting display panel will be described as the flexible display panel DP as a representative example.

The first outer member P1 is disposed under the flexible display panel DP. The first outer member P1 may include an optical film, e.g., a polarization film, a diffusion film, a protection film, etc. The first outer member P1 may be formed of a flexible plastic material.

The flexible display apparatus may further include an adhesive member disposed between the flexible display panel DP and the first outer member P1, to attach the first outer member P1 to the flexible display panel DP. The first outer member P1 will be described in detail later.

The second outer member P2 is disposed on the flexible display panel DP to face the first outer member P1.

The second outer member P2 may include at least one of a touch screen film and an optical film, e.g., a polarization film, a diffusion film, a protection film, etc. In addition, the second outer member P2 may further include a functional coating layer, e.g., an anti-fingerprint coating layer, an anti-reflection coating layer, etc. The second outer member P2 may be formed of a flexible plastic material.

The flexible display apparatus may further include an adhesive member disposed between the flexible display panel DP and the second outer member P2, to attach the flexible display panel DP to the second outer member P2.

Figure 2:
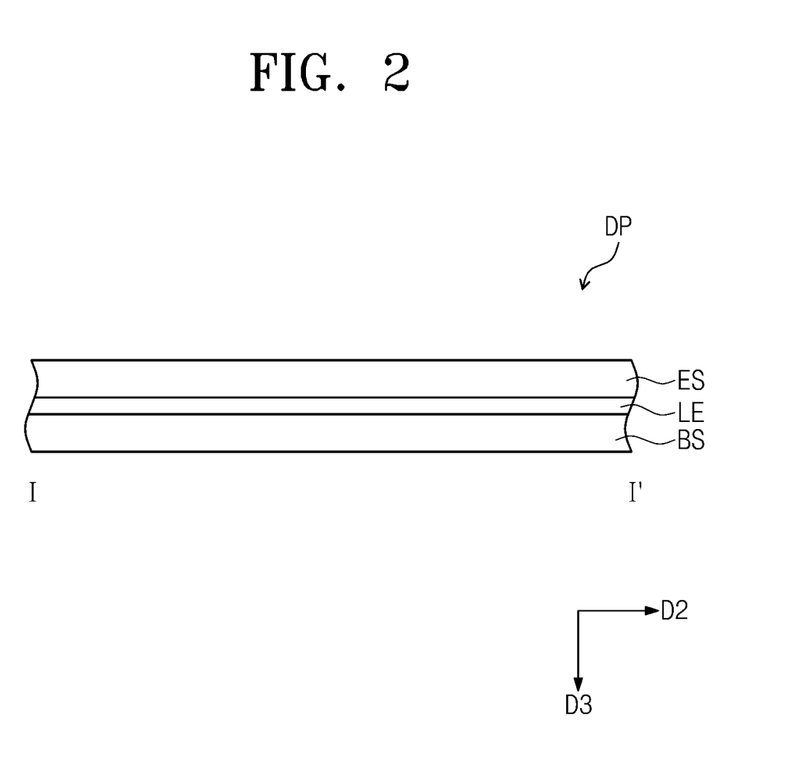
FIG. 2 is a cross-sectional view taken along the line I-I' shown in FIG. 1A to illustrate a flexible display panel according to an example embodiment of the present disclosure.
Figure 3:
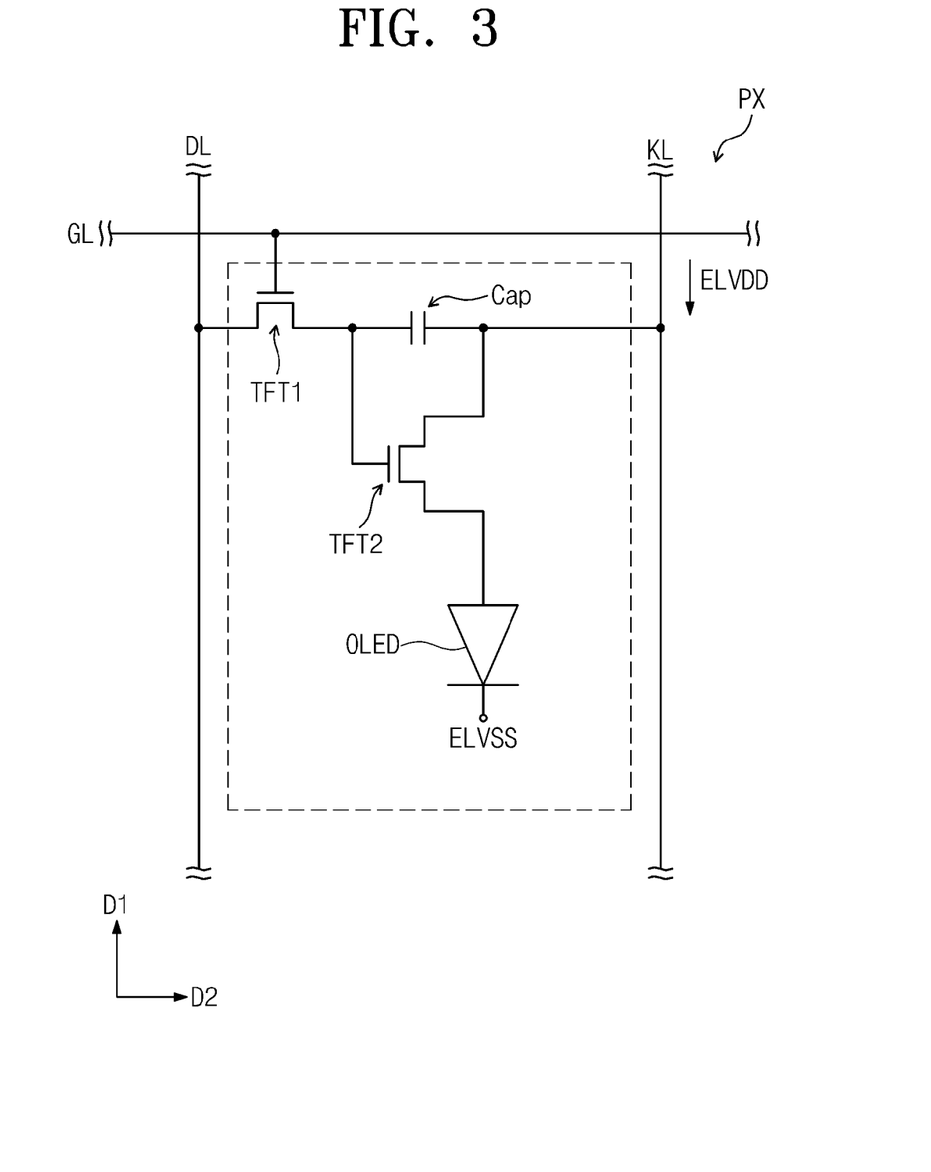
FIG. 3 is an equivalent circuit diagram showing a pixel of a flexible display panel according to an example embodiment of the present disclosure.

FIG. 2 is a cross-sectional view taken along the line I-I' shown in FIG. 1A to illustrate a flexible display panel, and FIG. 3 is an equivalent circuit diagram showing a pixel of a flexible display panel according to an example embodiment of the present disclosure.

Referring to FIGS. 2 and 3, the flexible display panel DP includes a base substrate BS, a display device layer LE disposed on the base substrate BS, and a sealing substrate ES disposed on the display device layer LE.

The base substrate BS is formed of a plastic material with high thermal resistance and high durability, such as polyethylene terephthalate (PET), polyethylene naphthalate (PEN), polycarbonate (PC), polyarylate (PAR), polyether imide (PEI), polyether sulfone (PES), polyimide (PI), etc., but the material for the base substrate BS should not be limited thereto or thereby.

The flexible display panel DP may further include a barrier layer disposed on the base substrate BS. The barrier layer includes at least one of an organic layer and an inorganic layer. The barrier layer prevents or substantially prevents foreign substances from entering into the display device layer LE after passing through the base substrate BS.

The display device layer LE includes signal lines disposed on the base substrate BS, and pixels PX electrically connected to the signal lines. The pixels PX generate the image (e.g., by emitting light) in response to signals provided from the signal lines. The signal lines include a gate line GL extending in the second direction D2, a data line DL extending in the first direction D1 crossing the second direction D2, and a power source line KL extending in parallel to or substantially in parallel to the data line DL to receive a first voltage ELVDD.

The pixel PX is connected to the gate line GL, the data line DL, and the power source line KL, and includes a first thin film transistor TFT1, a second thin film transistor TFT2, a capacitor Cap, and an organic light emitting diode OLED. The first thin film transistor TFT1, the capacitor Cap, and the second thin film transistor TFT2 form a circuit part to control the organic light emitting diode OLED. However, the present invention is not limited thereto, and the pixel PX may include at least one thin film transistor to control the organic light emitting diode OLED.

The first thin film transistor TFT1 outputs a data signal applied to the data line DL in response to a gate signal applied to the gate line GL. The second thin film transistor TFT2 controls a driving current flowing through the organic light emitting diode OLED in response to an amount of electric charges charged in the capacitor Cap.

The organic light emitting diode OLED includes a first electrode (e.g., an anode) and a second electrode (e.g., a cathode). The first electrode receives a voltage corresponding to the first voltage ELVDD from the second thin film transistor TFT2, and the second electrode receives a second voltage ELVSS. The organic light emitting diode OLED emits light during a turn-on period of the second thin film transistor TFT2, but the configuration of the pixel PX should not be limited thereto or thereby.

The sealing substrate ES (e.g., sealing layer) may be a flexible plastic substrate, but the present invention is not limited thereto, and the sealing substrate ES may be replaced with a sealing thin layer.

Figure 4:
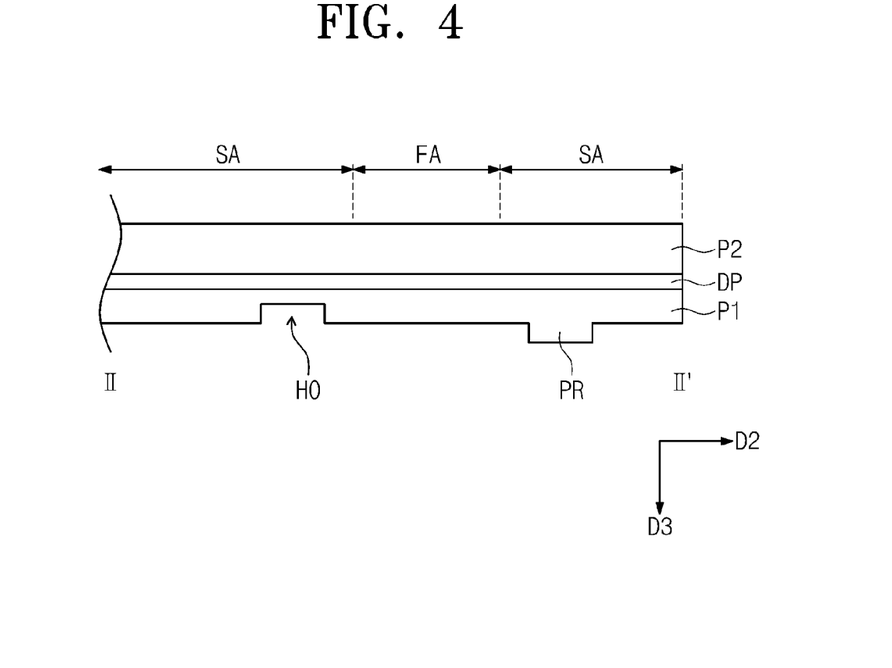
FIG. 4 is a cross-sectional view taken along the line II-II' shown in FIG. 1B.

Hereinafter, the flexible display apparatus folded in the folding area FA will be described in detail with reference to cross-sectional views. FIG. 4 is a cross-sectional view taken along the line II-II' shown in FIG. 1B to illustrate the flexible display apparatus that is stretched out, and FIG. 5 is a cross-sectional view taken along the line III-III' shown in FIG. 1B to illustrate the flexible display apparatus that is folded.

Figure 5:
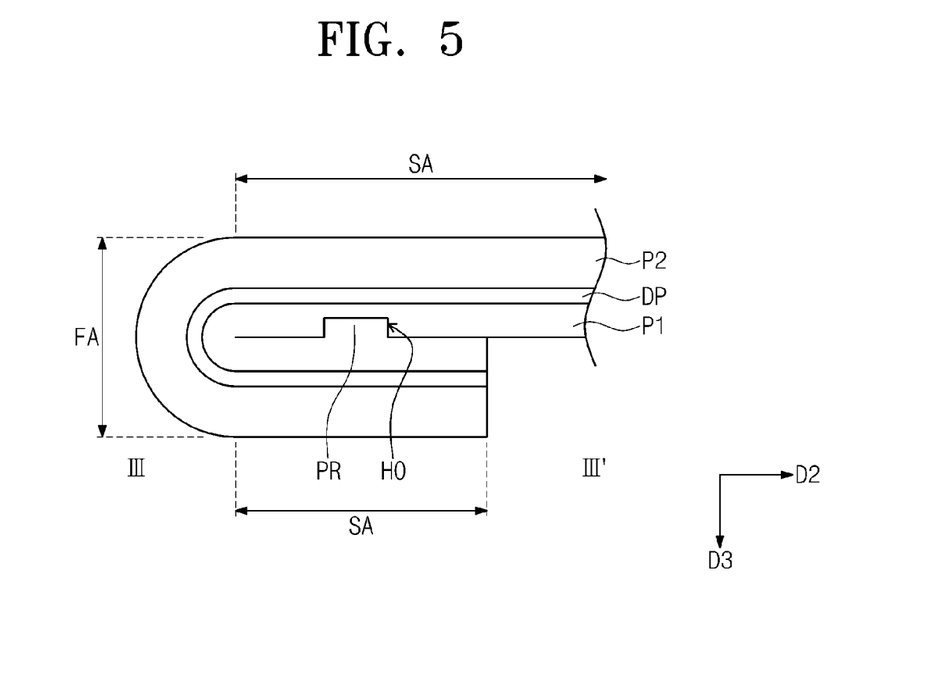
FIG. 5 is a cross-sectional view taken along the line III-III' shown in FIG. 1B.

Referring to FIGS. 1B, 4, and 5, the flexible display apparatus includes the folding area FA disposed at the edges of the short sides and extending in the first direction D1. The flexible display apparatus is folded in the folding area FA, such that the peripheral areas SA disposed respectively adjacent to both sides of the folding area FA are overlapped with each other. In the present example embodiment, the flexible display apparatus is folded in the lower direction, and thus, portions of the surface (e.g., the lower surface) of the first outer member P1 in the peripheral areas SA face each other and contact each other.

The first outer member P1 has a protrusion PR and a hole HO (e.g., an opening or an indentation), which are respectively formed in the peripheral areas SA disposed at both sides of the folding area FA. The protrusion PR and the hole HO are respectively disposed at both sides of the folding area FA. The protrusion PR is inserted into and fixed to the hole HO, when the flexible display apparatus is folded.

The protrusion PR is protruded from one surface of the first outer member P1 toward the third direction D3, and corresponds to a portion of the first outer member P1. In this case, the protrusion PR has a height, e.g., a length extending from the surface of the first outer member P1 in the third direction D3, equal to or less than a thickness of the first outer member P1.

The protrusion PR has a quadrangular shape when viewed in a plan view. The protrusion PR may have a rectangular shape extending in the first direction D1. The protrusion PR may have a width of about 10 micrometers to about 100 micrometers, but the width of the protrusion PR should not be limited thereto or thereby.

The hole HO is formed in a portion of the first outer member P1, which faces the protrusion PR when the flexible display apparatus is folded. The hole HO is formed by removing the portion of the first outer member P1. In this case, the thickness of the first outer member P1 in the area in which the hole HO is formed is smaller than that of the first outer member P1 in the area adjacent to the hole HO. In another embodiment of the present invention, the hole may be formed at the portion of the first outer member and the surface of the flexible display panel may be exposed through the hole.

The hole HO may have the quadrangular shape corresponding to that of the protrusion PR when viewed in a plan view. The hole HO may have the rectangular shape extending in the first direction D1 when viewed in a plan view. However, the shape of the hole HO should not be limited to a specific shape as long as the protrusion PR may be inserted into and fixed to the hole HO.

When the protrusion PR is inserted into and fixed to the hole HO, the flexible display apparatus may maintain the folded state thereof, even though a repulsive force is generated after the flexible display panel DP, the first outer member P1, and the second outer member P2 are folded in the folding area FA. As a result, the flexible display apparatus may maintain the folded state.

In the present example embodiment, the folded state of the flexible display apparatus may be easily maintained, since the protrusion PR formed on the first outer member P1 is inserted into and fixed to the hole HO formed by removing the portion of the first outer member P1, but the present invention should not be limited thereto or thereby. According to another embodiment, the first outer member may include a first coupling member and a second coupling member, which are respectively disposed in the peripheral areas at both sides of the folding area, and coupled to each other. The first and second coupling members are coupled to each other when the flexible display apparatus is folded, and the shape and material of the first and second coupling members should not be limited to specific shapes and materials as long as the folded state may be maintained regardless of the repulsive force generated after the flexible display apparatus is folded.

Figure 6A:
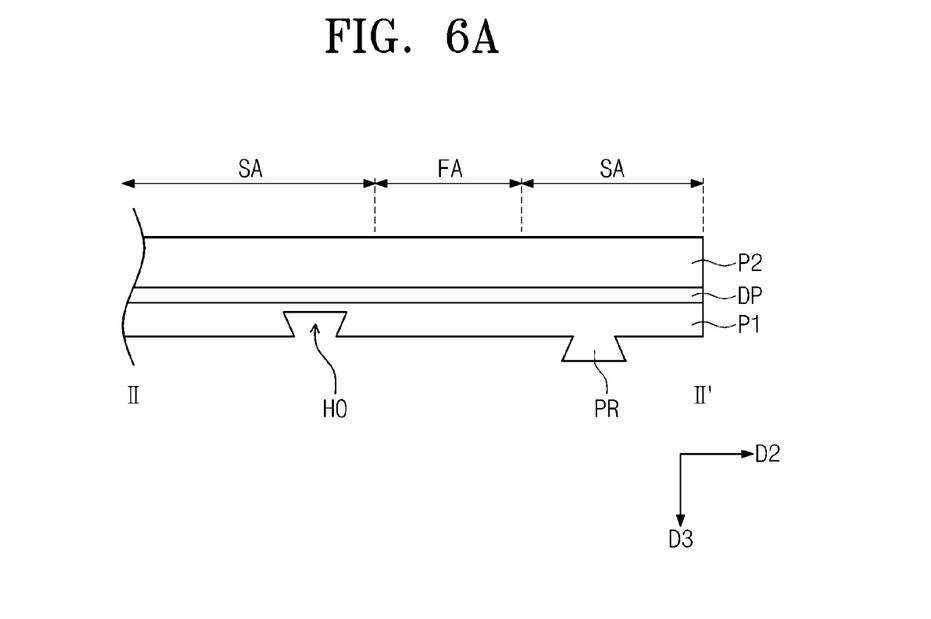
FIGS. 6A and 6B are cross-sectional views showing a flexible display apparatus according to other example embodiments of the present disclosure.
Figure 6B:
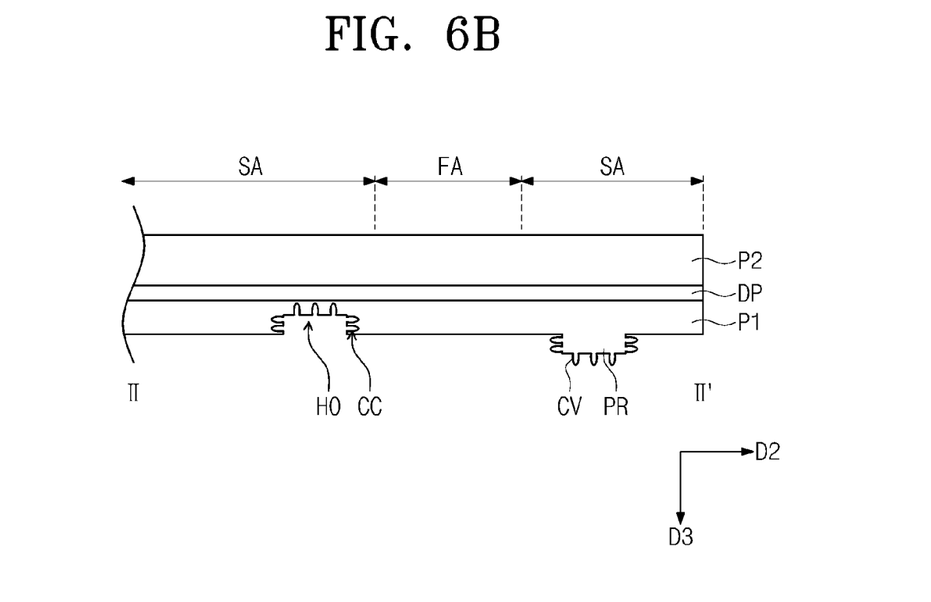

Hereinafter, various shapes of the protrusion PR and the hole HO will be described with reference to FIGS. 6A and 6B. In FIGS. 6A and 6B, for the convenience of illustration, the same reference numerals denote the same or substantially the same elements shown in FIGS. 1A, 1B, and 2 to 5, and thus detailed descriptions of the same or substantially the same elements will be omitted.

FIG. 6A is a cross-sectional view showing a flexible display apparatus according to another example embodiment of the present disclosure.

Referring to FIG. 6A, the protrusion PR is protruded from the portion of the one surface of the first outer member P1 toward the third direction D3. The width of the protrusion PR increases as a distance from the surface of the first outer member P1 increases along the third direction D3.

The hole HO is formed on the portion of the first outer member P1, which faces the protrusion PR when the flexible display apparatus is folded. The hole HO is formed by removing the portion of the first outer member P1. In this case, the thickness of the first outer member P1 in the area in which the hole HO is formed is smaller than the thickness of the first outer member P1 in the area adjacent to the hole HO. In another embodiment, the hole may be formed in the portion of the first outer member, and the surface of the flexible display panel may be exposed through the hole.

The hole HO has the shape corresponding to that of the protrusion PR. In the present example embodiment, the width of the hole HO is increased as a distance from the surface of the first outer member P1 decreases along an opposite direction to the third direction D3.

As described above, since the width of an entrance of the hole HO is smaller than the width inside the hole HO, the protrusion PR inserted into the hole HO is difficult to be separated from the hole HO. Therefore, the protrusion PR may be more securely fixed to the hole HO than that when the width of the entrance of the hole HO is equal to the width inside the hole HO.

FIG. 6B is a cross-sectional view showing a flexible display apparatus according to another example embodiment of the present disclosure.

Referring to FIG. 6B, the protrusion PR is protruded from the surface of the first outer member P1 toward the third direction D3. The protrusion PR includes a plurality of convex portions CV protruding from a surface of the protrusion PR.

The hole HO is formed on the portion of the first outer member P1, which faces the protrusion PR when the flexible display apparatus is folded. The hole HO is formed by removing the portion of the first outer member P1. In this case, the thickness of the first outer member P1 in the area in which the hole HO is formed is smaller than the thickness of the first outer member P1 in the area adjacent to the hole HO. In another embodiment, the hole may be formed at the portion of the first outer member, and the surface of the flexible display panel may be exposed through the hole.

The hole HO has the shape corresponding to that of the protrusion PR. In the present example embodiment, the first outer member P1 includes a plurality of concave portions CC formed in the area in which the hole HO is formed. The convex portions CV of the protrusion PR are respectively inserted into the concave portions CC.

As described above, since the convex portions CV of the protrusion PR are inserted into the concave portions CC, the protrusion PR may be securely fixed to the hole HO.

Figure 7:
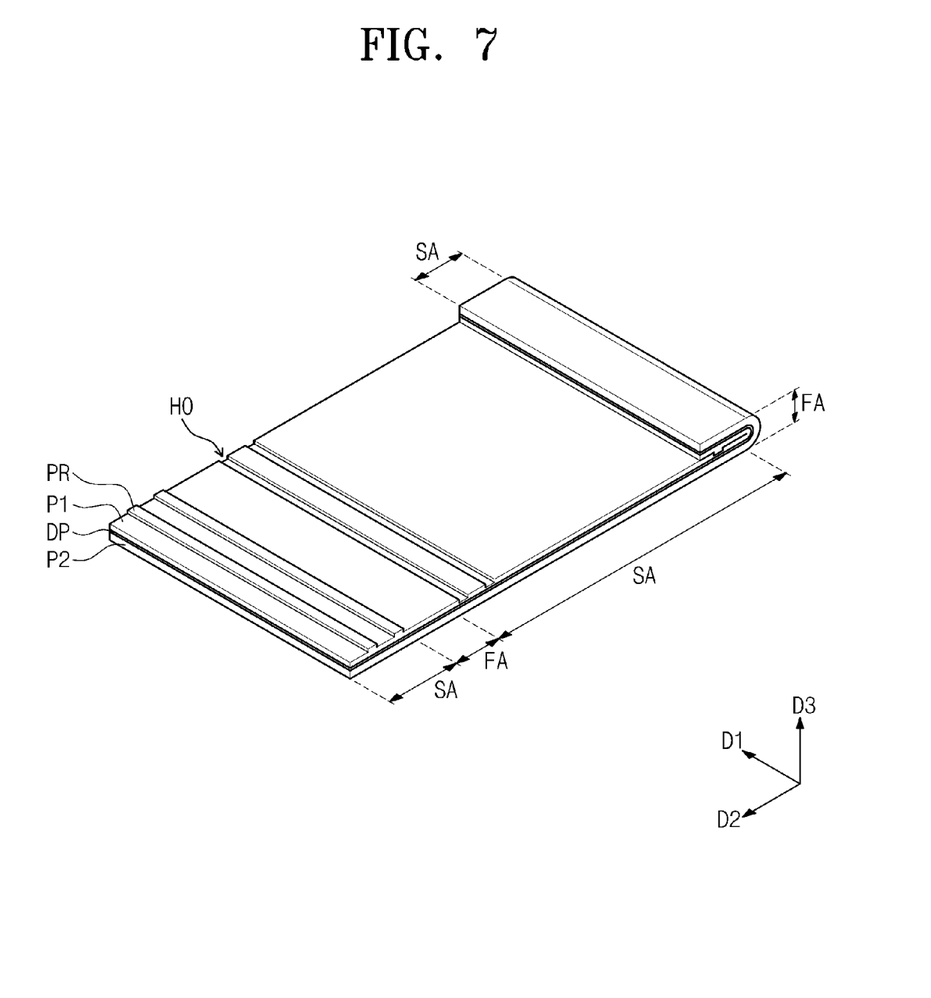
FIGS. 7 and 8 are perspective views showing a flexible display apparatus according to other example embodiments of the present disclosure.

FIG. 7 is a perspective view showing a flexible display apparatus according to another example embodiment of the present disclosure.

Referring to FIG. 7, a plurality of protrusions PR is disposed on the first outer member P1 in the one side of the folding area FA, and extends in the first direction D1. The protrusions PR are arranged in parallel to or substantially in parallel to each other in the second direction D2, which is perpendicular to or substantially perpendicular to the first direction D1, at regular intervals.

FIG. 7 shows two protrusions PR, but the number of the protrusions PR should not be limited to two. A distance between the protrusions PR is in a range from about 10 micrometers to about 100 micrometers, however the distance between the protrusions PR should not be limited thereto or thereby.

In the other side of the folding area FA, a plurality of holes HO is disposed in the first outer member P1, and extends in the first direction D1. The holes HO are arranged in parallel to or substantially in parallel to each other along the second direction D2 at regular intervals. The shape and number of the holes HO correspond to the shape and number of the protrusions PR.

In another embodiment, at least one hole and at least one protrusion may be formed on the first outer member in the one side of the folding area, and extend in the first direction. The hole and the protrusion in the one side of the folding area are arranged in parallel to or substantially in parallel to each other and spaced apart from each other. In addition, at least one protrusion and at least one hole may be formed on the first outer member in the other side of the folding area. The protrusion and the hole in the other side of the folding area are arranged in parallel to or substantially in parallel to each other and spaced apart from each other.

Figure 8:
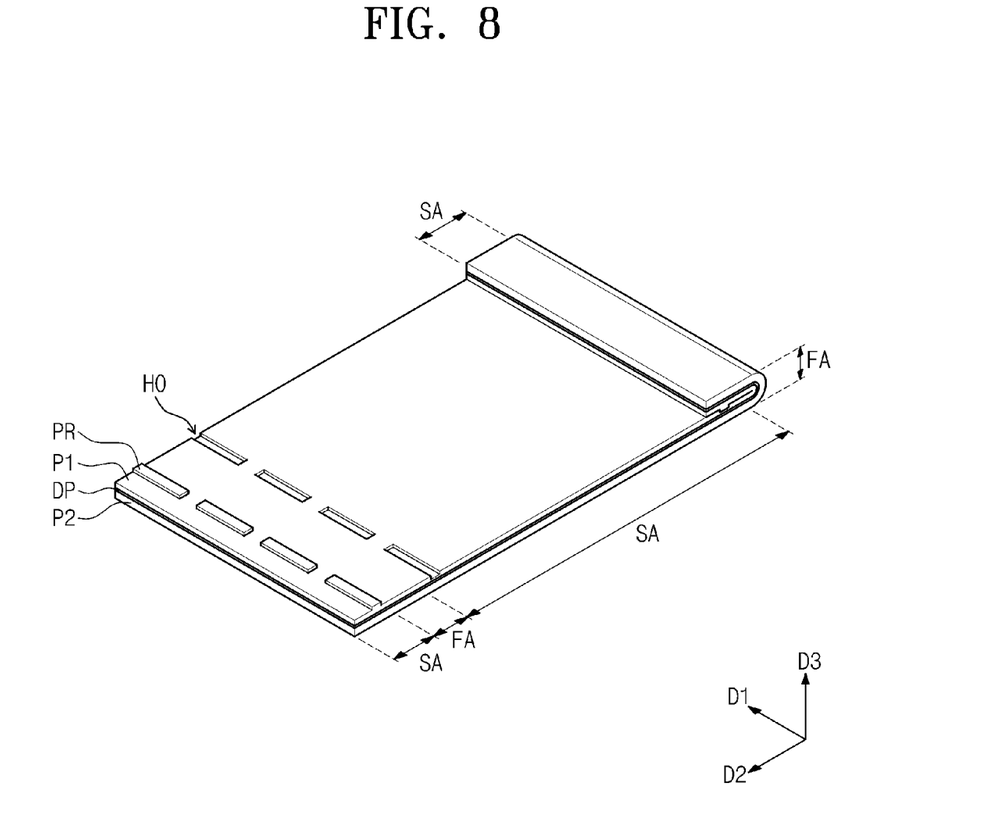

FIG. 8 is a perspective view showing a flexible display apparatus according to another example embodiment of the present disclosure.

Referring to FIG. 8, a plurality of protrusions PR is disposed on the first outer member P1 in the one side of the folding area FA. The protrusions PR are arranged in the first direction D1 and spaced apart from each other at regular intervals. FIG. 8 shows four protrusions PR, but the number of the protrusions PR should not be limited to four.

A plurality of holes HO is disposed in the first outer member P1 in the other side of the folding area FA. The holes HO are arranged in the first direction D1, and spaced apart from each other at regular intervals. The shape and number of the holes HO correspond to the shape and number of the protrusion PR.

As described above, when the protrusions PR and the holes HO are formed in the first outer member P1, the folded state of the flexible display apparatus may be securely maintained compared to that of the flexible display apparatus having one protrusion PR and one hole HO.

In another embodiment, at least one hole and at least one protrusion may be formed on the first outer member in the one side of the folding area and arranged in the first direction at regular intervals. In addition, at least one protrusion and at least one hole may be formed on the first outer member in the other side of the folding area and arranged in the first direction at regular intervals.

Figure 9A:
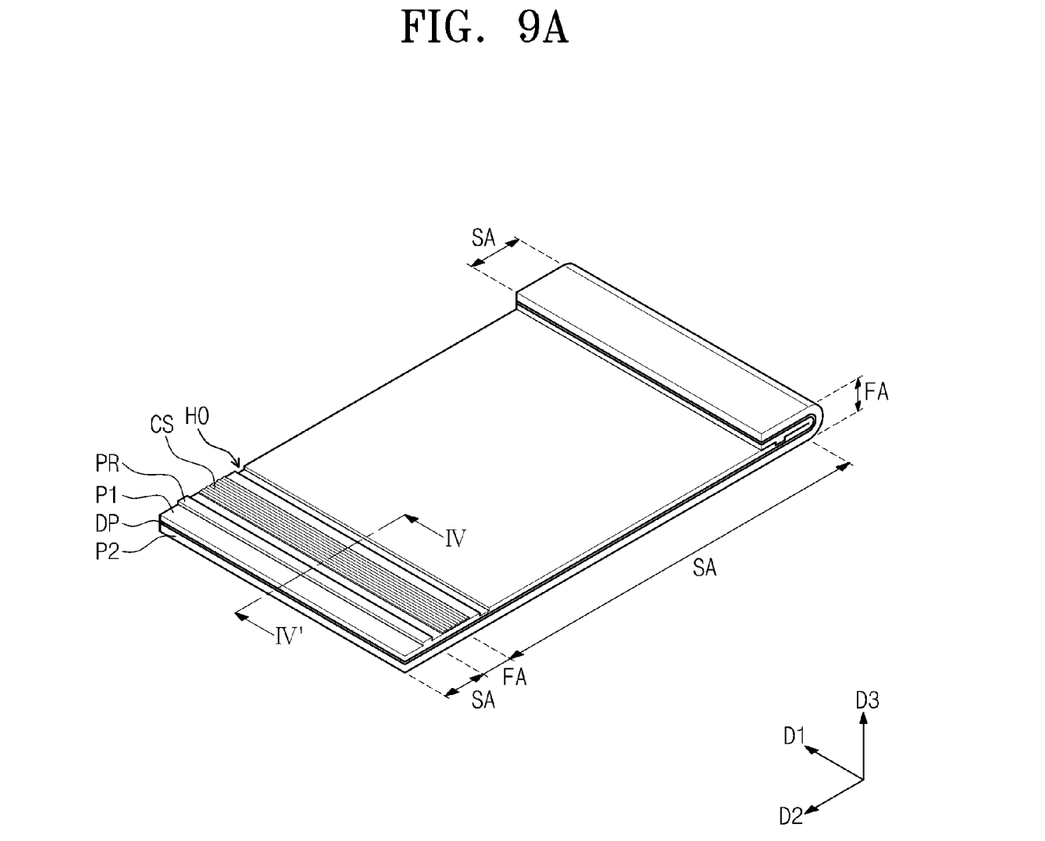
FIG. 9A is a perspective view showing a flexible display apparatus according to another example embodiment of the present disclosure.
Figure 9B:
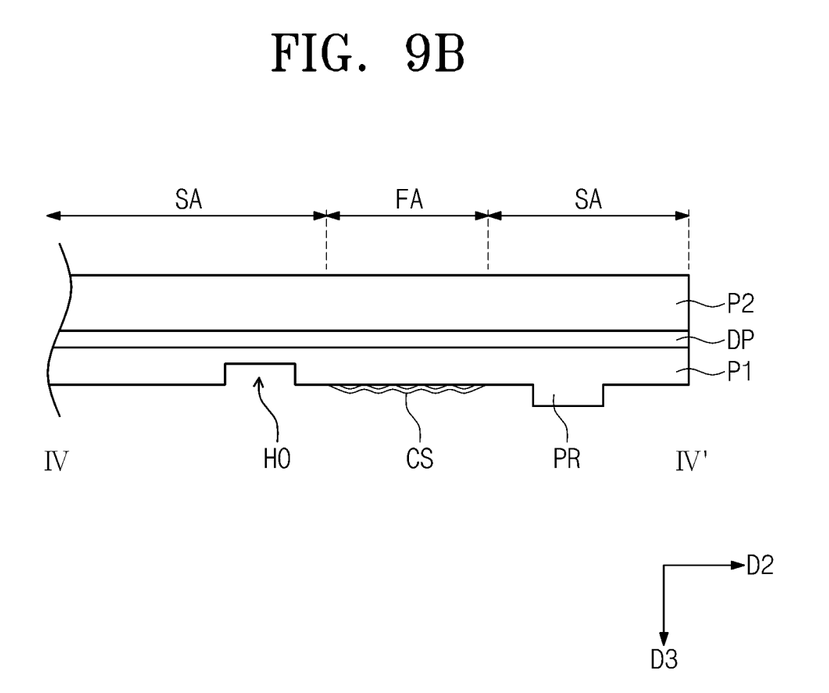
FIG. 9B is a cross-sectional view taken along the line IV-IV' shown in FIG. 9A.

FIG. 9A is a perspective view showing a flexible display apparatus according to another example embodiment of the present disclosure, and FIG. 9B is a cross-sectional view taken along the line IV-IV' shown in FIG. 9A. In FIGS. 9A and 9B, the same reference numerals denote the same or substantially the same elements shown in FIGS. 7 and 8, and thus detailed descriptions of the same or substantially the same elements will be omitted.

Referring to FIGS. 9A and 9B, the flexible display apparatus includes a flexible display panel DP configured to display the image, a first outer member P1 disposed on one surface of the flexible display panel DP, a second outer member P2 disposed on the other surface of the flexible display panel DP, and a wrinkle sheet CS. The flexible display apparatus includes a folding area FA, in which the flexible display apparatus is folded, and peripheral areas SA adjacent to the folding area FA.

The first outer member P1 has a protrusion PR and a hole HO, which are respectively formed in the peripheral areas SA disposed at both sides of the folding area FA. The protrusion PR and the hole HO are respectively disposed at both sides of the folding area FA. The protrusion PR is inserted into and fixed to the hole HO when the flexible display apparatus is folded.

The wrinkle sheet CS is disposed in the folding area FA to face the flexible display panel DP, and the first outer member P1 is disposed between the flexible display panel DP and the wrinkle sheet CS.

The wrinkle sheet CS extends in the first direction D1. The wrinkle sheet CS comprises a plurality of wrinkles extending in the first direction D1. However, the direction in which the wrinkles extend should not be limited to a specific direction, as long as the wrinkle sheet CS is folded in the folding area FA, and thus, the wrinkles may extend in the second direction D2. In addition, the wrinkles may have various shapes, e.g., a circular shape.

The wrinkle sheet CS is folded when the flexible display apparatus is folded. The folded wrinkle sheet CS maintains the folded state thereof, even though no external force is applied to the folded wrinkle sheet CS.

The wrinkle sheet CS may include a synthetic resin or a metal material, e.g., Cu, Cr, Ti, Mn, Fe, Co, Ni, Zn, Ag, Nb, Mo, Au, W, Pt, etc., but the material for the wrinkle sheet CS should not be limited thereto or thereby, as long as the wrinkle sheet CS maintains the folded state thereof.

As described above, since the flexible display apparatus includes the wrinkle sheet CS that maintains the folded state thereof, the flexible display apparatus may maintain the folded state thereof even though the repulsive force is generated in the folding area FA. As a result, the flexible display apparatus including the wrinkle sheet CS may more securely maintain the folded state than that of the flexible display apparatus having no wrinkle sheet.

Figure 10A:
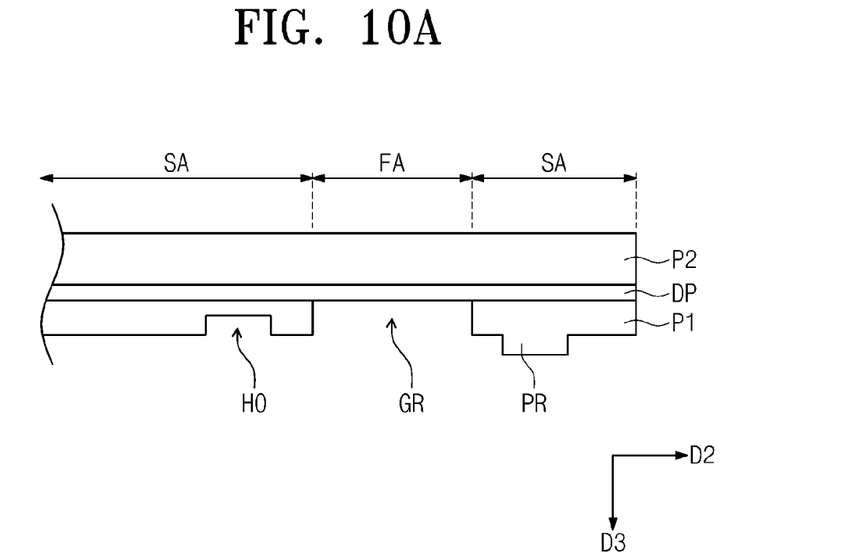
FIGS. 10A and 10B are cross-sectional views showing a flexible display apparatus according to another example embodiment of the present disclosure.
Figure 10B:
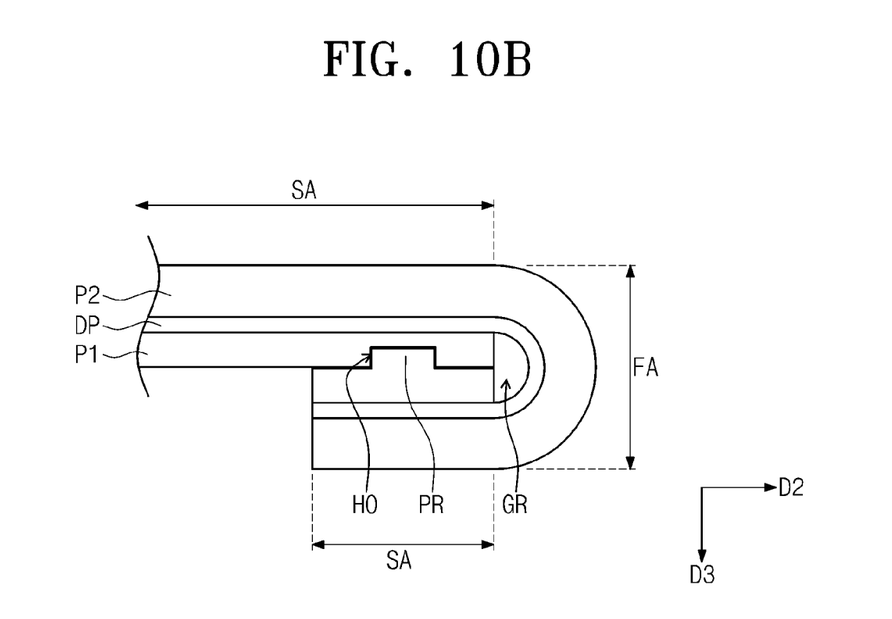

FIG. 10A is a cross-sectional view showing a flexible display apparatus according to another example embodiment of the present disclosure, and FIG. 10B is a cross-sectional view showing a folded state of the flexible display apparatus shown in FIG. 10A.

Referring to FIGS. 10A and 10B, the first outer member P1 has a protrusion PR and a hole HO, which are respectively formed in the peripheral areas SA disposed at both sides of the folding area FA. The protrusion PR and the hole HO are respectively disposed at both sides of the folding area FA. The protrusion PR is inserted into and fixed to the hole HO when the flexible display apparatus is folded.

The first outer member P1 further has a groove GR formed therein to correspond to the folding area FA. The groove GR is formed by removing a portion of the first outer member P1, and the portion of the one surface of the flexible display panel DP is exposed through the groove GR. In another embodiment, a thickness of the first outer member in the area in which the groove is formed may be smaller than that of the first outer member in the area adjacent to the groove.

When the flexible display apparatus is folded, a compressive stress occurs in the first outer member P1 and a tensile stress occurs in the second outer member P2.

Accordingly, the groove GR is formed in the folding area FA of the first outer member P1 in order to remove or reduce the compressive stress applied to the first outer member P1. The groove GR is formed in the folding area FA, e.g., an area in which the compressive stress becomes maximized when the flexible display apparatus is folded.

In this case, a neutral plane exists between the first outer member P1 and the second outer member P2, on which the compressive or tensile force does not occur. When the neutral plane is disposed on the flexible display panel DP, the stress applied to the flexible display panel DP is minimized, and thus the flexible display panel DP may be prevented from being damaged even though the flexible display panel DP is folded. For example, according to the present example embodiment, the neutral plane may move to the flexible display panel DP from the first outer member P1, due to the groove GR formed in the first outer member P1. Therefore, the signal lines may be prevented from being cracked when the flexible display panel DP is folded.

Figure 11:
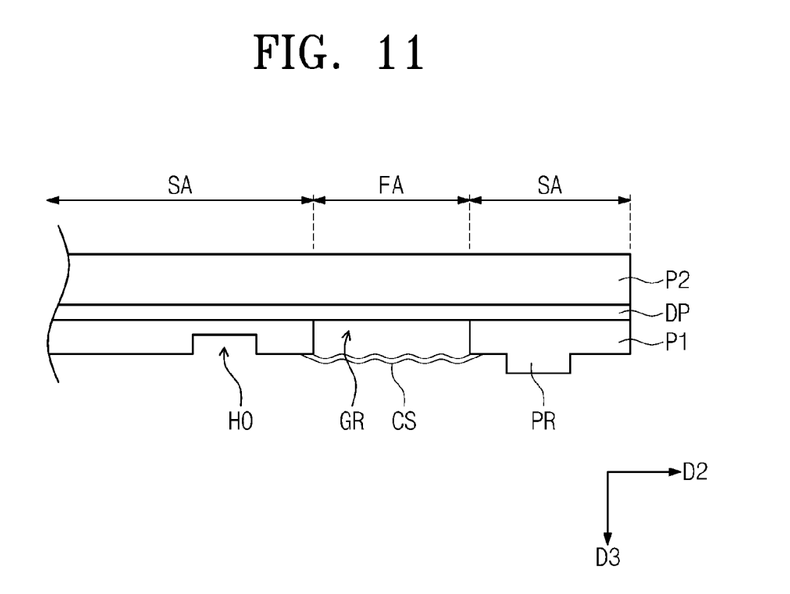
FIGS. 11 and 12 are cross-sectional views showing a flexible display apparatus according to other example embodiments of the present disclosure.

FIG. 11 is a cross-sectional view showing a flexible display apparatus according to another example embodiment of the present disclosure.

Referring to FIG. 11, the flexible display apparatus includes a flexible display panel DP configured to display the image, a first outer member P1 disposed on one surface of the flexible display panel DP, a second outer member P2 disposed on the other surface of the flexible display panel DP, and a wrinkle sheet CS.

The first outer member P1 has a protrusion PR and a hole HO, which are respectively formed in the peripheral areas SA disposed at both sides of the folding area FA. The protrusion PR and the hole HO are respectively disposed at both sides of the folding area FA. The protrusion PR is inserted into and fixed to the hole HO when the flexible display apparatus is folded.

The first outer member P1 further has a groove GR formed therein to correspond to the folding area FA. The groove GR is formed by removing a portion of the first outer member P1, and the portion of the one surface of the flexible display panel DP is exposed through the groove GR. In another embodiment, a thickness of the first outer member in the area in which the groove is formed may be smaller than that of the first outer member in the area adjacent to the groove.

The wrinkle sheet CS is disposed over the groove GV in the folding area FA to face the flexible display panel DP.

The wrinkle sheet CS is folded together with the flexible display apparatus when the flexible display apparatus is folded. The folded wrinkle sheet CS may maintain the folded state thereof, even though no external force is applied to the folded wrinkle sheet CS.

Figure 12:
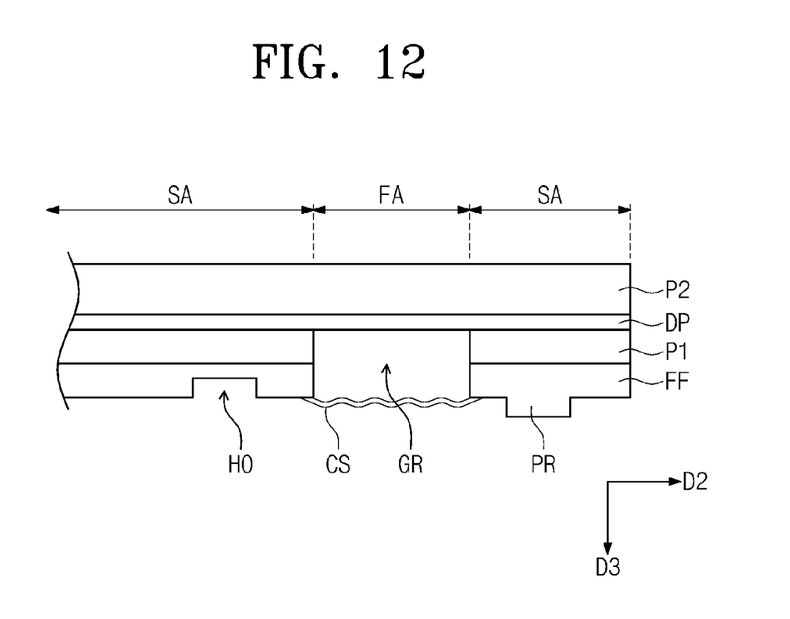

FIG. 12 is a cross-sectional view showing a flexible display apparatus according to another example embodiment of the present disclosure.

Referring to FIG. 12, the flexible display apparatus includes a flexible display panel DP configured to display the image, a first outer member P1 disposed on one surface of the flexible display panel DP, a second outer member P2 disposed on the other surface of the flexible display panel DP, a flexible film FF disposed under the first outer member P1 to face the flexible display panel DP, and a wrinkle sheet CS.

The flexible film FF has a protrusion PR and a hole HO, which are respectively formed in the peripheral areas SA disposed at both sides of the folding area FA. The protrusion PR and the hole HO are respectively disposed at both sides of the folding area FA. The protrusion PR is inserted into and fixed to the hole HO when the flexible display apparatus is folded.

The first outer member P1 and the flexible film FF further have a groove GR formed therethrough to correspond to the folding area FA. The groove GR is formed by removing a portion of each of the first outer member P1 and the flexible film FF. The portion of the one surface of the flexible display panel DP is exposed through the groove GV. In another embodiment, however, the groove may be formed by removing only the portion of the flexible film, and in this case, the portion of the surface of the first outer member is exposed through the groove formed through the flexible film.

The flexible film FF has an elastic modulus greater than that of the first outer member P1. Thus, the flexible display apparatus may be easily folded in the folding area FA.

The wrinkle sheet CS is disposed over the groove GR in the folding area FA to face the flexible display panel DP.

The wrinkle sheet CS is folded together with the flexible display apparatus when the flexible display apparatus is folded. The folded wrinkle sheet CS may maintain the folded state thereof even though no external force is applied to the folded wrinkle sheet CS.

As described above, the flexible display apparatus includes the flexible film FF that is easily folded, and the wrinkle sheet CS that maintains the folded state thereof, and thus, the flexible display apparatus may maintain the folded state thereof even though the repulsive force generated in the folding area FA is applied to the flexible display apparatus. As a result, the flexible display apparatus may more securely maintain the folded state thereof. Here, the repulsive force refers to force that acts to unfold the flexible display apparatus when in the folded state.

Although the example embodiments of the present invention have been described, it is understood that the present invention should not be limited to these example embodiments, but various changes and modifications can be made as understood by one of ordinary skilled in the art within the spirit and scope of the present invention as hereinafter claimed, including the equivalents thereof.

What is claimed is:

1. A flexible display apparatus comprising a folding area and peripheral areas at sides of the folding area, the flexible display apparatus comprising:
   a flexible display panel configured to display an image; and
   an outer member on one surface of the flexible display panel and comprising a protrusion and an opening at the peripheral areas,
   wherein the flexible display panel and the outer member are configured to be folded at the folding area, and the protrusion is inserted into the opening when the outer member is folded.

2. The flexible display apparatus of claim 1, wherein the folding area is at at least one edge of the flexible display apparatus and extends in a first direction.

3. The flexible display apparatus of claim 2, wherein the protrusion is protruded from one surface of the outer member and extends in the first direction.

4. The flexible display apparatus of claim 3, wherein the protrusion comprises a plurality of protrusions, and the plurality of protrusions are arranged along a second direction perpendicular to the first direction at regular intervals.

5. The flexible display apparatus of claim 2, wherein the protrusion comprises a plurality of protrusions, and the plurality of protrusions are arranged along the first direction at regular intervals.

6. The flexible display apparatus of claim 1, wherein the protrusion has a quadrangular shape when viewed in a plan view.

7. The flexible display apparatus of claim 1, wherein the protrusion comprises a plurality of convex portions protruding from a surface of the protrusion.

8. The flexible display apparatus of claim 1, wherein the opening is formed by removing a portion of the outer member corresponding to a shape of the protrusion.

9. The flexible display apparatus of claim 2, further comprising a wrinkle sheet at the folding area facing the flexible display panel such that the outer member is between the flexible display panel and the wrinkle sheet, wherein the wrinkle sheet comprises a plurality of wrinkles extending in the first direction.

10. The flexible display apparatus of claim 9, wherein the wrinkle sheet comprises a metal material.

11. The flexible display apparatus of claim 2, wherein the outer member further has a groove corresponding to the folding area.

12. The flexible display apparatus of claim 11, wherein a portion of the one surface of the flexible display panel is exposed through the groove.

13. The flexible display apparatus of claim 11, further comprising a wrinkle sheet over the groove and facing the flexible display panel,
wherein the wrinkle sheet comprises a plurality of wrinkles extending in the first direction.

14. A flexible display apparatus comprising a folding area and peripheral areas at sides of the folding area, the flexible display apparatus comprising:
a flexible display panel configured to display an image;
an outer member on one surface of the flexible display panel; and
a flexible film facing the flexible display panel such that the outer member is between the flexible film and the flexible display panel, the flexible film comprising a protrusion and an opening at the peripheral areas,
wherein the flexible display panel, the outer member, and the flexible film are configured to be folded at the folding area, and the protrusion is inserted into the opening when the flexible film is folded.

15. The flexible display apparatus of claim 14, wherein the flexible film has an elastic modulus greater than an elastic modulus of the outer member.

16. The flexible display apparatus of claim 15, wherein the folding area is at at least one edge of the flexible display apparatus and extends in a first direction.

17. The flexible display apparatus of claim 16, wherein the protrusion is protruded from one surface of the flexible film and extends in the first direction.

18. The flexible display apparatus of claim 17, wherein the opening is formed by removing a portion of the flexible film corresponding to a shape of the protrusion.

19. The flexible display apparatus of claim 18, wherein the flexible film and the outer member further has a groove corresponding to the folding area.

20. The flexible display apparatus of claim 19, further comprising a wrinkle sheet over the groove and facing the flexible display panel, wherein the wrinkle sheet comprises a plurality of wrinkles extending in the first direction.

* * * * *